(12) United States Patent
Yu et al.

(10) Patent No.: US 10,897,236 B2
(45) Date of Patent: Jan. 19, 2021

(54) WIDEBAND SIGNAL BUFFER

(71) Applicant: Apple Inc., Cupertino, CA (US)

(72) Inventors: Chuanzhao Yu, Phoenix, AZ (US);
Kurt Hausmann, Chandler, AZ (US);
Stephen Rector, Tempe, AZ (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 16/183,320

(22) Filed: Nov. 7, 2018

(65) Prior Publication Data
US 2020/0144977 A1  May 7, 2020

(51) Int. Cl.
| | |
|---|---|
| *H03G 3/30* | (2006.01) |
| *H03G 1/00* | (2006.01) |
| *H03F 1/56* | (2006.01) |
| *H03F 3/193* | (2006.01) |
| *H03F 3/68* | (2006.01) |
| *H03H 7/38* | (2006.01) |

(52) U.S. Cl.
CPC ........... *H03G 1/0029* (2013.01); *H03F 1/565* (2013.01); *H03F 3/193* (2013.01); *H03F 3/68* (2013.01); *H03G 3/3036* (2013.01); *H03G 3/3089* (2013.01); *H03F 2200/387* (2013.01); *H03F 2200/451* (2013.01); *H03H 7/38* (2013.01)

(58) Field of Classification Search
CPC .. H03G 1/0029; H03G 3/3036; H03G 3/3089; H03G 2201/206; H03G 2201/40; H03G 3/001; H03G 1/0088; H03G 1/0023; H03G 3/3042; H03F 1/565; H03F 3/193; H03F 3/68; H03F 2200/387; H03F 2200/451; H03F 1/0277; H03F 3/45179; H03F 3/195; H03F 3/45; H03F 3/245; H03F 3/191; H03F 1/56; H03H 7/38
USPC .................................................. 330/278, 302
See application file for complete search history.

(56) References Cited

U.S. PATENT DOCUMENTS

| | | | | |
|---|---|---|---|---|
| 7,696,823 | B2* | 4/2010 | Khorramabadi | .... H01F 17/0013 330/253 |
| 8,330,544 | B2* | 12/2012 | Kawakami | ................ H03F 1/56 330/255 |
| 9,369,103 | B2 | 6/2016 | Morishita | |

(Continued)

OTHER PUBLICATIONS

International Search Report and Written Opinion dated Jan. 8, 2020 for PCT Application PCT/US2019/054957.

*Primary Examiner* — Khanh V Nguyen
(74) *Attorney, Agent, or Firm* — Eschweiler & Potashnik, LLC

(57) ABSTRACT

Wideband signal buffers that can be employed for mmWave (millimeter wave) communication are disclosed. One example signal buffer comprises a variable gain amplifier (VGA) that receives two control words and outputs a feedback signal, wherein both an amplitude and a phase of the feedback signal are based on the two control words and on a bias voltage; and a matching network comprising a first inductor that outputs the bias voltage, a second inductor, and a third inductor that receives the feedback signal from the VGA, and wherein the first, second, and third inductors are magnetically coupled to each other, wherein the signal buffer is configured to receive a RF (Radio Frequency) input and to generate a RF output from the RF input based on a transfer function of the signal buffer, wherein the transfer function is based at least in part on the feedback signal.

16 Claims, 18 Drawing Sheets

(56) References Cited

U.S. PATENT DOCUMENTS

| | | | |
|---|---|---|---|
| 2009/0251218 A1* | 10/2009 | Oliveira | H03G 3/10 |
| | | | 330/278 |
| 2011/0018635 A1 | 1/2011 | Tasic | |
| 2011/0115565 A1* | 5/2011 | Cabanillas | H03F 3/72 |
| | | | 330/307 |
| 2012/0032742 A1 | 2/2012 | Hsieh | |

* cited by examiner

Out of phase operation

In phase operation $$\frac{V_o}{I_i} = \frac{RL\,s\,(m13 + gm1\,m13\,(L2 + m23)\,s - gm1\,m12\,(L3 + m23)\,s))}{(RL + (L3 + gm1\,(L2 - m12 + m23)\,RL)\,s + (gm1\,(L2\,L3 - L3\,m12 + (m13 - m23)\,m23) + ci\,L1\,RL + c3\,L3\,RL)\,s^{\wedge}2 + (c3\,gm1\,(L2\,L3 - L3\,m12 + (m13 - m23)\,m23)\,RL + ci\,(-m13^{\wedge}2 - gm1\,m12\,(m12 + m13)\,RL + L1\,(L3 + gm1\,(L2 + m23)\,RL)))\,s^{\wedge}3 - ci\,(gm1\,(L3\,m12^{\wedge}2 + L2\,m13^{\wedge}2 - 2\,m12\,m13\,m23 + L1\,(-L2\,L3 + m23^{\wedge}2)) + c3\,(-L1\,L3 + m13^{\wedge}2)\,RL)\,s^{\wedge}4 - c3\,ci\,gm1\,(L3\,m12^{\wedge}2 + m13\,(L2\,m13 - 2\,m12\,m23) + L1\,(-L2\,L3 + m23^{\wedge}2))\,RL\,s^{\wedge}5)}$$

Negative Magnetic Feedback for M < N/2

Positive Magnetic Feedback for M > N/2

WIDEBAND SIGNAL BUFFER

FIELD

The present disclosure relates to wireless technology, and more specifically to techniques and systems employable as a signal buffer, for example, for mmWave (millimeter wave) communication.

BACKGROUND

Mobile communication has evolved significantly from early voice systems to today's highly sophisticated integrated communication platform. The next generation wireless communication system, 5G (or new radio (NR)) will provide access to information and sharing of data anywhere, anytime by various users and applications. NR is expected to be a unified network/system that target to meet vastly different and sometime conflicting performance dimensions and services. Such diverse multi-dimensional requirements are driven by different services and applications. In general, NR will evolve based on 3GPP (Third Generation Partnership Project) LTE (Long Term Evolution)-Advanced with additional potential new Radio Access Technologies (RATs) to enrich people lives with better, simple and seamless wireless connectivity solutions. NR will enable everything connected by wireless and deliver fast, rich contents and services.

NR will include bandwidths not employed in existing (e.g., current LTE-A (Long Term Evolution-Advanced)) systems, including mmWave frequency bands, which provides a significant increase in available bandwidth, but at higher frequencies than employed in existing systems. Because mmWave communication is at a substantially higher frequency than existing systems, some existing techniques and components are not well adapted to operating at mmWave frequencies. As one example, tuning based on capacitor arrays can be difficult to realize for mmWave frequencies.

DETAILED DESCRIPTION

Figure 1:
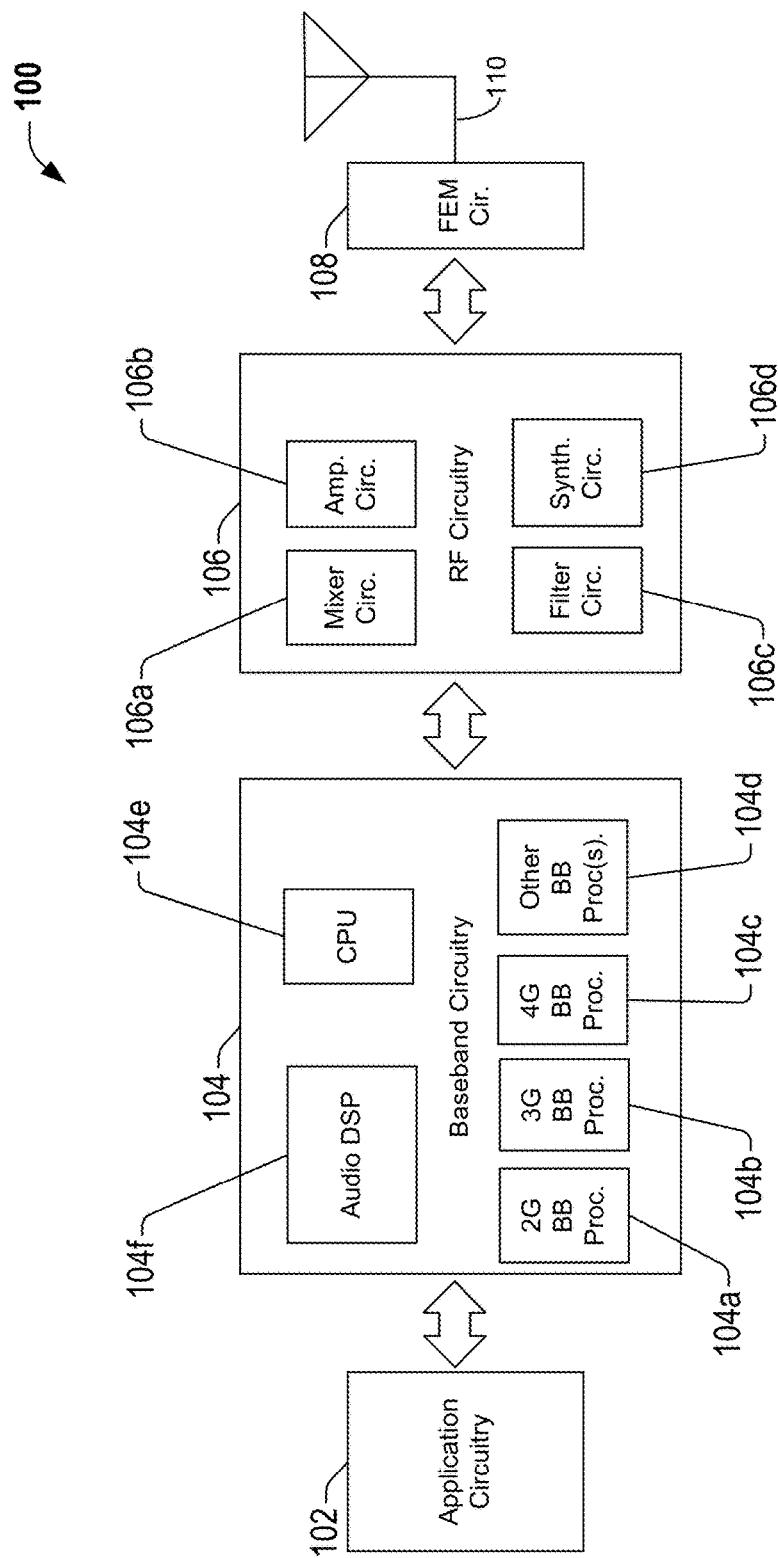
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Various embodiments discussed herein comprise a tunable matching network comprising a wideband signal buffer, and systems and techniques that employ a tunable matching network as discussed herein. Tunable matching networks and associated systems and techniques discussed herein can provide small variability for gain attenuation, good linearity, and constant input and output impedance with different gain settings. As such, apparatuses, systems, and methods discussed herein can be employed for 5G (Fifth Generation) NR, including mmWave, in a transceiver of a communication device such as a UE (User Equipment) or base station such as a gNB (next generation Node B) or eNB (Evolved Node B).

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EU-TRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, either as multiplication of signals or as a sampling of the signal, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or bandpass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature down conversion and/or up conversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct down conversion and/or direct up conversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency)

and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110).

In some embodiments, the UE device 100 may include additional elements such as, for example, memory/storage, display, camera, sensor, and/or input/output (I/O) interface.

Figure 2:
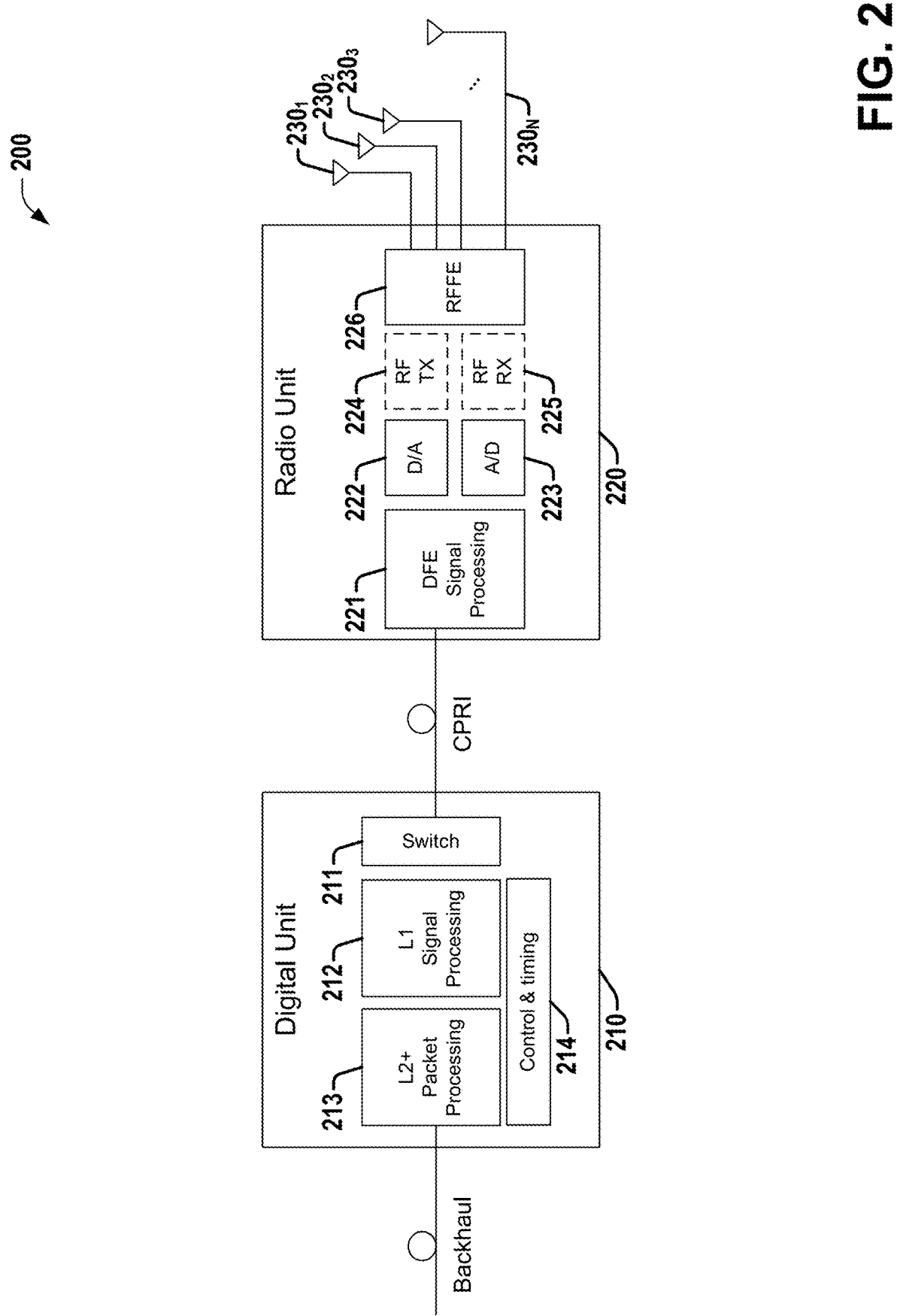
FIG. 2 is a block diagram illustrating example components of a Base Station (BS) device (e.g., eNB, gNB, etc.) that can be employed in connection with various aspects discussed herein.

Referring to FIG. 2, illustrated are example components of a Base Station (BS) device (e.g., eNB, gNB, etc.) 200 that can be employed in connection with various aspects discussed herein. In some embodiments, the BS device 200 can comprise a digital unit 210 and one or more radio units 220, each of which can be connected to one or more antennas $230_i$.

The digital unit 210 can comprise a switch 211, layer 1 (L1) signal processing circuitry 212, layer 2+ (L2+) packet processing circuitry 213, and control and timing circuitry 214. The digital unit 210 can perform at least the following functions: (a) Switching (e.g., via switch 211) between various radio units (on cell towers or roof tops), and various baseband cards, in the digital unit; (b) Layer 1 signal processing (e.g., via L1 signal processing circuitry 212), performing the modulation/demodulation and forward error correction functions of actual waveforms to be transmitted on different RF carriers and bands; (c) Layer 2 scheduling of users (e.g., via L2+ packet processing circuitry 213); (d) Layer 2/layer 3 packet processing (e.g., via L2+ packet processing circuitry 213); (e) Control plane processing and timing/synchronization (e.g., via control and timing circuitry 214); and (f) Encryption of packets going into the backhaul (e.g., via control and timing circuitry 214). In various embodiments, the backhaul link to the core network can be one or more of wired (e.g., copper, fiber, etc.) or wireless (for example, via a mesh network comprising one or more additional access points, etc.).

Each radio unit 220 can comprise DFE (Digital Front End) signal processing circuitry 221, one or more digital to analog converters (DACs) 222 associated with transmit chain(s), one or more analog to digital converters (ADCs) 223 associated with receive chain(s), optional RF (Radio Frequency) transmit circuitry 224 associated with transmit chain(s), optional RF (Radio Frequency) receive circuitry 225 associated with receive chain(s), and RF FE (Front End) circuitry 226. The digital unit 210 can perform at least the following functions: (a) Digital front-end (DFE) signal processing (perform digital IF carrier combining, crest factor reduction, digital pre-distortion of Power Amplifiers) (e.g., via DFE signal processing circuitry 221); (b) Digital to Analog and Analog to Digital conversion (e.g., via DACs 222 and ADCs 223); (c) RF mixing (i.e. modulation), and RF frequency synthesizers; (d) RF Front-end functions: power amplifiers (PA), low-noise amplifiers (LNA), Variable gain amplifiers (VGA), filters, switches (TDD) or duplexers (FDD) (e.g., via RF front end circuitry 226). In aspects omitting RF transmit circuitry 224 and/or RF receive circuitry 225, The DACs 222 and/or ADCs 223 can work at RF sampling rates, making analog/RF modulation/demodulation unnecessary.

From radio unit(s) 220, the RF signal can be fed to antennas $230_i$. In current radio base-stations, antennas are external, and there is an industry effort to develop Active antenna systems (AAS) with integrated RF and antenna arrays, for example, for 5G.

In various embodiments, tunable matching networks discussed herein (and/or associated systems and techniques) can be employed in a NR communication device, for example, UE 100 or BS 200.

Figure 3:
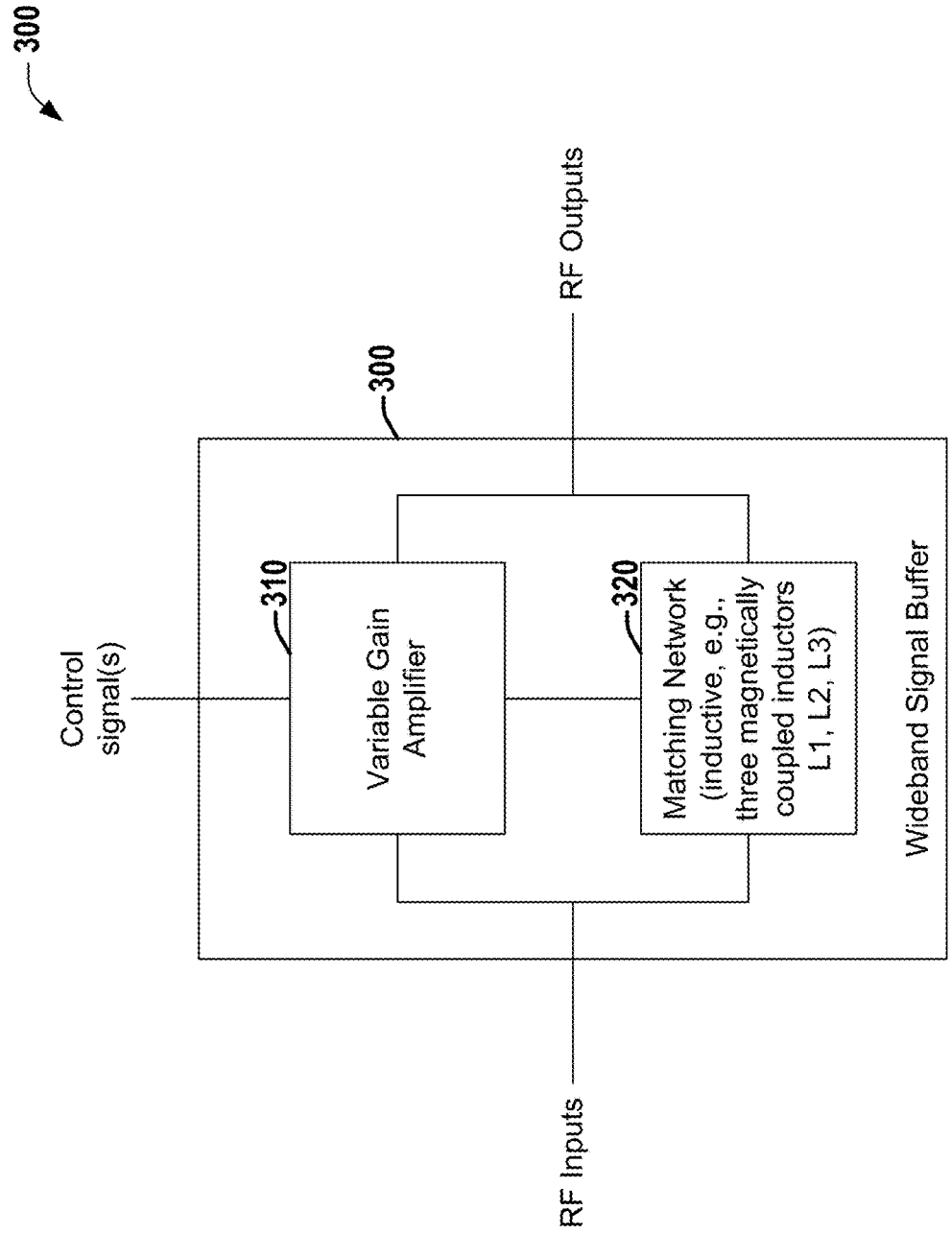
FIG. 3 is a block diagram illustrating an example signal buffer according to various aspects discussed herein.

Referring to FIG. 3, illustrated is a block diagram of an example signal buffer 300 according to various aspects discussed herein. Signal buffer 300 comprises a variable gain amplifier (VGA) 310 coupled to an inductive matching network 320, which can comprise three magnetically coupled inductors (referred to herein as L1, L2, and L3), which can facilitate magnetic feedback via adjustable current steering, providing adjustable tuning via the 3 windings of matching network 320. Variable gain amplifier 310 can receive one or more control words, and based on the control word(s), can provide variable strength (e.g., negative, zero, or positive) feedback via matching network 320, allowing tuning of a transfer function of signal buffer 300 (generating RF output(s) based on RF input(s) to signal buffer 300). In various embodiments discussed herein, VGA 310 can comprise a configurable bit-slice common-gate buffer that can be employed to provide the variable strength feedback. Because of the ability to provide tuning of the transfer function via current steering of matching network 320 via VGA 310, the transfer function of signal buffer 300 can be tuned without capacitor arrays. Additionally, because in embodiments discussed herein the feedback can be magnetically coupled via one of the inductors (L3) of matching network 320, the layout of signal buffer 300 is not substantially increased over existing transformer matching networks.

Embodiments discussed herein can provide a compact layout area that can save cost, the ability to employ feedback to make the bandwidth wider, and input/output impedance that can be kept constant. In contrast to existing systems based on capacitor array In various embodiments, VGA 310 can comprise a plurality of bit slice units, each of which can be controlled by associated bit(s) of the control word(s), to provide control over the magnitude and phase (e.g., positive or negative) of the magnetic feedback. As explained below, various embodiments can provide for constant input/output impedance for each gain setting, and neutralization for each bit-slice.

Various embodiments discussed herein can provide multiple advantages over existing systems: (1) Local neutralization for each bit-slice unit of VGA 310 can reduce gain variability, reduce input load, and improve linearity; (2)

Constant input and output impedances for any gain settings can provide for superior gain step accuracy; (3) Simple/straight connections for input/output RF path for bi-directional connectivity can facilitate mmWave operations; (4) Good match between bit slice units of VGA 310 over PVT (process, voltage, temperature) variation can provide accurate gain controls and stable controls over PVT variation; (5) Out-of-phase signal cancelling between two adjacent bit-slice units of VGA 310 can provide low power leakage; (6) Programmable positive/negative feedback for VGA 310 with in-phase or out-phase signals of the VGA 310 coupling back to the inter-stage matching can provide a wide fine-tune range; (7) Per inter-stage matching, with three inductor windings together in embodiments of matching network 320 can reduce layout area; (8) Bandwidth boost ring can boost the band width; (9) Multiple poles can provide a wide bandwidth; and (10) an inductor of the matching network 320 (e.g., L2) can cancel the buffer input in-series capacitance, which can provide low input impedance and high linearity for the current-mode pre-stage.

Figure 4:
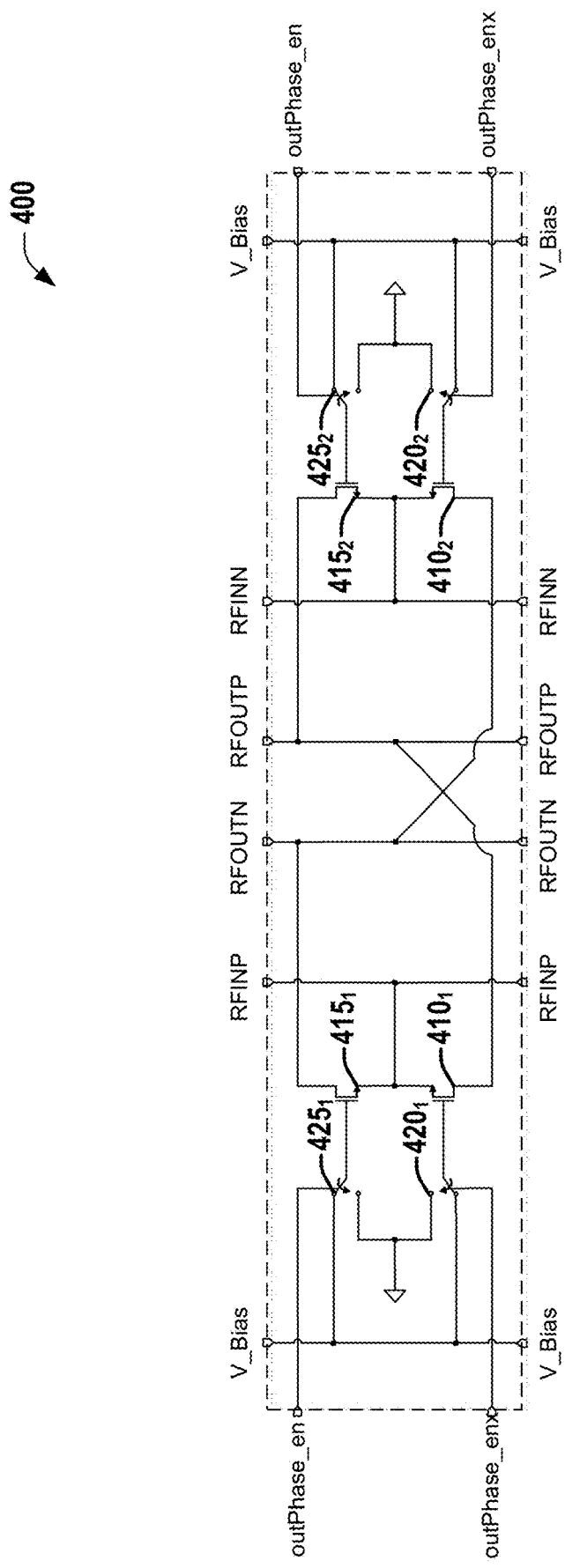
FIG. 4 is a diagram illustrating an example bit slice that can be employed as part of a variable gain amplifier, according to various aspects discussed herein.

In various embodiments, VGA 310 comprises multiple bit-slices in-parallel. Referring to FIG. 4, illustrated is a diagram showing an example bit-slice 400 that can be employed in a variable gain amplifier in accordance with various aspects discussed herein. In various embodiments, all the bit-slices can have the same design as example bit-slice 400. In each bit-slice 400, the two transistors $410_1$ and $410_2$ (e.g., NMOS transistors, etc.) can operate as 0 degree of phase (in-phase) amplifiers. The two transistors $415_1$ and $415_2$ (e.g., NMOS transistors, etc.) can operate as 180 degree of phase (out-of-phase) amplifiers. Two inverted control signals (e.g., outPhase_en and outPhase_enx in FIG. 4) can be used to control the on or off of the transistors $410_1$, $410_2$, $415_1$, and $415_2$.

If outPhase_en=1 (and outPhase_enx=0), the switches $425_1$ and $425_2$ switch the gates of transistors $415_1$ and $415_2$ to V_Bias. The voltage V_Bias can establish the DC operation point for transistors $415_1$ and $415_2$. Thus, when outPhase_en=1, the transistors $415_1$ and $415_2$ are in the "on" state. Meanwhile, the transistors $410_1$ and $410_2$ are connected to the ground by the switches $420_1$ and $420_2$. Thus, when outPhase_en=1 (and outPhase_enx=0), transistors $410_1$ and $410_2$ turn off. The RFINP current flowing into the $415_1$ transistor source terminal is coupled to the RFOUTN terminal, and the RFINN current flowing into the $415_2$ terminal flows is coupled to the RFOUTP terminal. Thus, when outPhase_en=1 (and outPhase_enx=0), the output current signal has 180 degree of phase shift compared to the input current.

If outPhase_en=0 (outPhase_enx=1), the switches $420_1$ and $420_2$ switch the gates of transistors $410_1$ and $410_2$ to V_Bias, which establishes the DC operation point for transistors $410_1$ and $410_2$. Thus, when outPhase_en=0, the transistors $410_1$ and $410_2$ are in the "on" state. Meanwhile, the transistors $415_1$ and $415_2$ are connected to the ground by the switches, so transistors $415_1$ and $415_2$ turn off. The RFINP current flowing into the $410_1$ transistor source terminal is coupled to the RFOUTP terminal, and the RFINN current flowing into the $410_2$ terminal flows is coupled to the RFOUTN terminal. Thus, when outPhase_en=0 (and outPhase_enx=1), the output current signal has the same phase as the input current.

Figure 5:
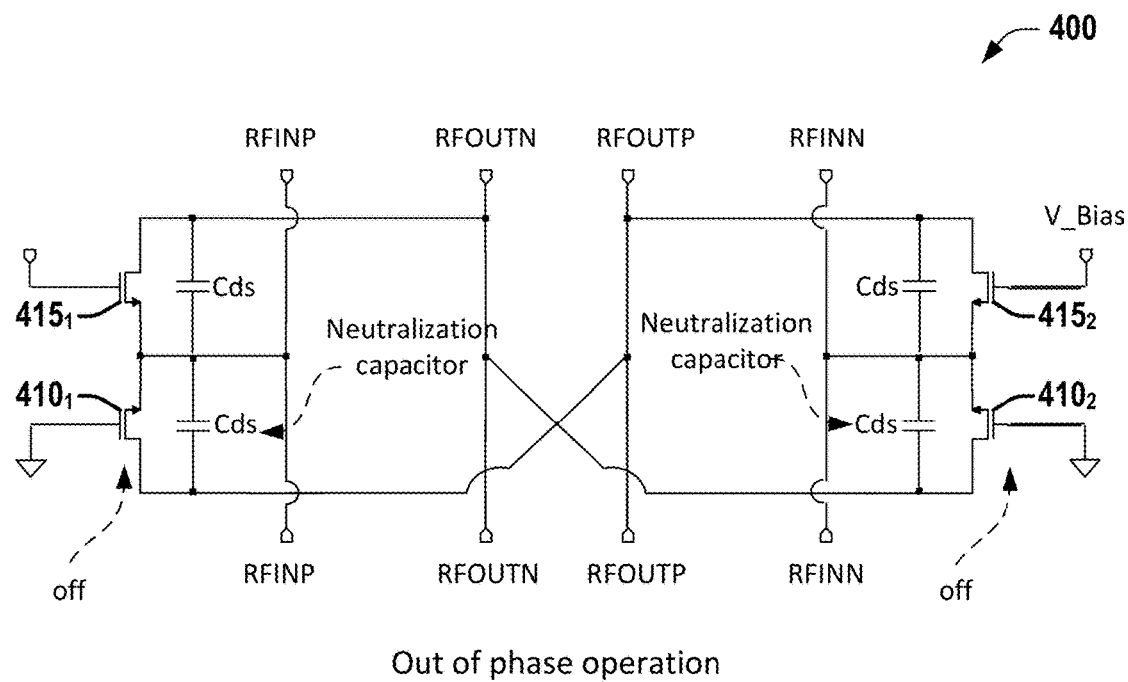
FIG. 5 is a pair of diagrams illustrating examples of in-phase operation (top) and out-of-phase operation of the example bit slice of FIG. 4, according to various aspects discussed herein.
Figure 5:
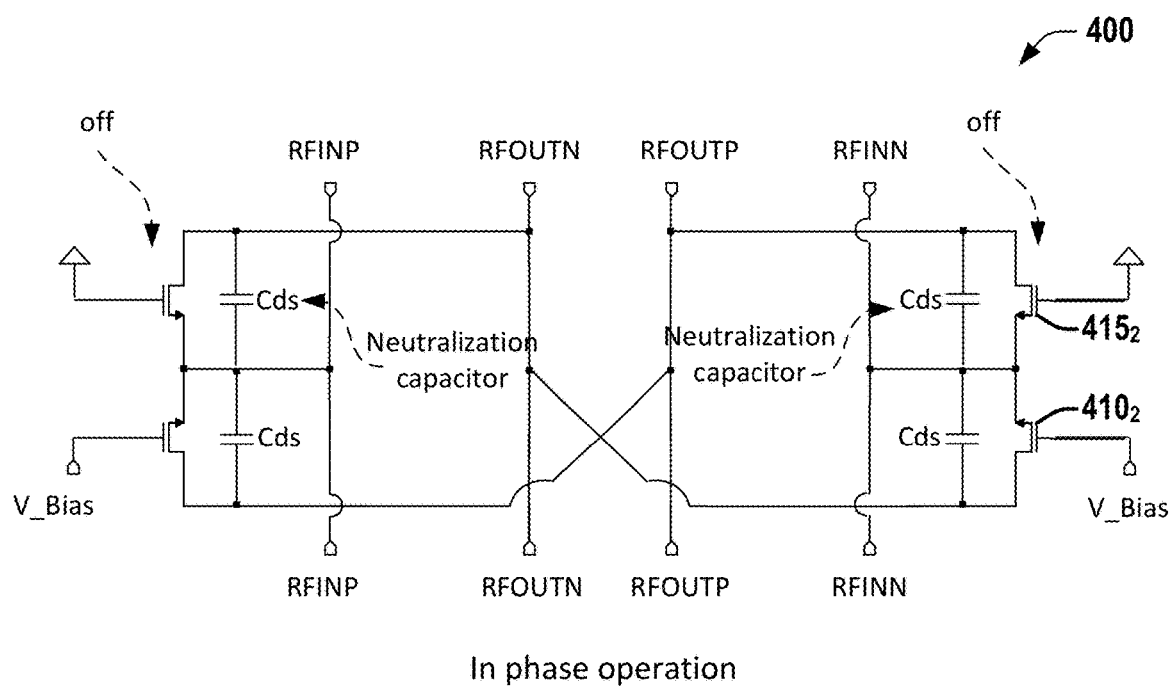

Referring to FIG. 5, illustrated is a pair of diagrams showing the example bit-slice of FIG. 4 in examples of out-of-phase operation (top) and in-phase operation (bottom), according to various aspects discussed herein. In the out-of-phase operation shown at the top of FIG. 5, transistors $415_1$ and $415_2$ work as a complimentary common-gate amplifier (with gate DC operation point set by V_Bias), and transistors $410_1$ and $410_2$ are off (gate coupled to ground). Since the input signals coupled to the RFINP and RFINN are a differential signal (equal magnitude and opposite orientation/phase), the output signals from RFOUTP and RFOUTN are differential (180 degrees out of phase). In various embodiments, the sizes of all the four transistors $410_1$, $415_2$, $415_1$, and $415_2$ can be designed to be the same. Thus, the parasitic capacitance—Cds in FIG. 5 of the on transistors ($415_1$ and $415_2$) can be exactly the same as the off transistors ($410_1$ and $410_2$). The current through Cds of transistor $415_1$ can thereby be neutralized by a current of equal magnitude and opposite orientation through a neutralizing capacitance—Cds of transistors $410_1$, as shown in the top diagram of FIG. 5. Similarly, the current through Cds of transistor $415_2$ can be neutralized by a current of equal magnitude and opposite orientation through neutralizing capacitance—Cds of transistor $410_2$. The "off" transistors $410_1$ and $410_2$ can thereby operate as neutralization device for transistors $415_1$ and $415_2$, which operates as a complimentary common-gate amplifier. The neutralization of bit-slice 400 provides a better way to improve the isolation between the input and the output.

Similarly, for the in-phase operation, the transistors $410_1$ and $410_2$ can operate as a complimentary common-gate amplifier (with gate DC operation point set by V_Bias), and transistors $415_1$ and $415_2$ are off (gate coupled to ground). The parasitic Cds of the transistors $415_1$ and $415_2$ can operate as neutralization capacitance for the Cds of the transistors $410_1$ and $410_2$, as shown in the lower diagram of FIG. 5.

For each bit slice, the design of bit slice 400 can keep input impedance and output impedance the same for in-phase operation and out of phase operation. The bit slice can be configured for in phase operation or out phase operation via the control of outPhase_en and outPhase_enx.

Figure 6:
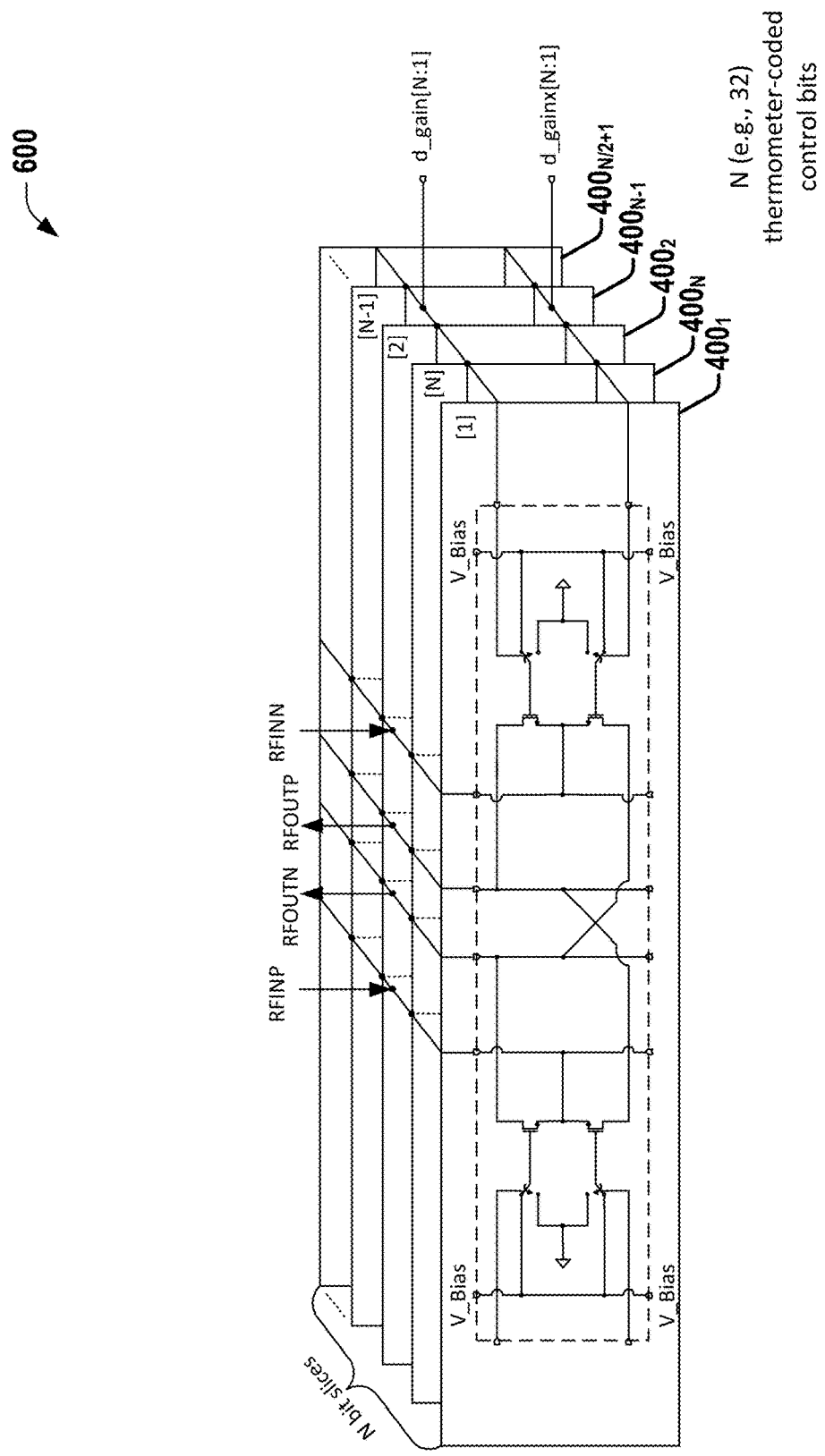
FIG. 6 is a diagram illustrating an example variable gain amplifier comprising multiple example bit slices, according to various aspects discussed herein.

Multiple (e.g., N) of the bit slices 400 can stack together to form a variable gain common-gate amplifier that can be employed as VGA 310. Referring to FIG. 6, illustrated is a diagram showing an example variable gain common-gate amplifier 600 comprising multiple bit slices $400_1$-$400_N$ in accordance with various aspects discussed herein. Each control of the bit slices can be connected to a separate digital control bit. Two complementary N-bit control words (e.g., via N-bit programmed buses), d_gain[N:1] and d_gainx[N:1], can be used to control the variable gain amplifier 600. These two complementary control words can satisfy the condition in Equation (1):

$$d\_gainx = \overline{d\_gain} \quad (1)$$

The control words (e.g., from the programmed buses) can be thermometer-coded and each bit can be connected to the control of each bit slice $400_i$, wherein each bit of the d_gain can be coupled to the outPhase_en of one bit slice $400_i$ and each bit of the d_gainx can be coupled to the outPhase_enx of one bit slice $400_i$. In various embodiments, N can be an even number. In both d_gain and d_gainx controls, as shown in FIG. 6, the bits N/2+1 to N can be arranged in reversed order to and interleaved with bits 1 to N. If all the bits of d_gain are set to 0 (and the complement control d_gainx all to 1), all the bit-slice units $400_i$ will employ in-phase operation. In such a scenario, the output signals of all the units $400_i$ are all in-phase and sum together, the amplitude has a maximum value, and the phase is a 0 degree shift from the input signal. Conversely, if all the bits of d_gain are set to 1, all the bit-slice units $400_i$ will be out-of-phase, the amplitude will again have a maximum value, and the phase will be a 180 degree shift from the input signal. If M of the N bit slices $400_i$ are out-of-phase, the number of in-phase bit slices $400_i$ is N-M. In such a scenario, the total output signal is as in Equation (2):

$$A(N-M)e^{j0°} + Me^{j180°} = A(N-2M) \qquad (2)$$

where A is the output signal magnitude of a single bit slice $400_i$.

When M=N/2, the output signal has amplitude 0 (half of the units $400_i$ have a 0 degree shift from input signal and half of the units $400_i$ have a 180 degree shift from input signal). If M<N/2, the output signal has 0° of phase shift from the input signal and the amplitude decreases linearly with increasing M. If M>N/2, the output signal has 180° of phase shift from input signal and the amplitude increases linearly with increasing M.

The pre-scrambled interleaved pattern for the d_gain and d_gainx controls discussed herein have the in-phase and out-of-phase bit slices $400_i$ cancel the output signal with a neighboring unit $400_i$. Due to good matching between the neighboring units $400_i$, superior gain control accuracy can be realized, and the gain step can be independent of process, voltage, and temperature variations.

Since each of the bit slices $400_i$ have the same input impedance for the in-phase state and the out-of-phase state, the input impedance of amplifier 600 can be kept constant under any gain settings. Meanwhile, the output impedance of amplifier 600, which is independent of gain settings, can also be kept constant.

Figure 7:
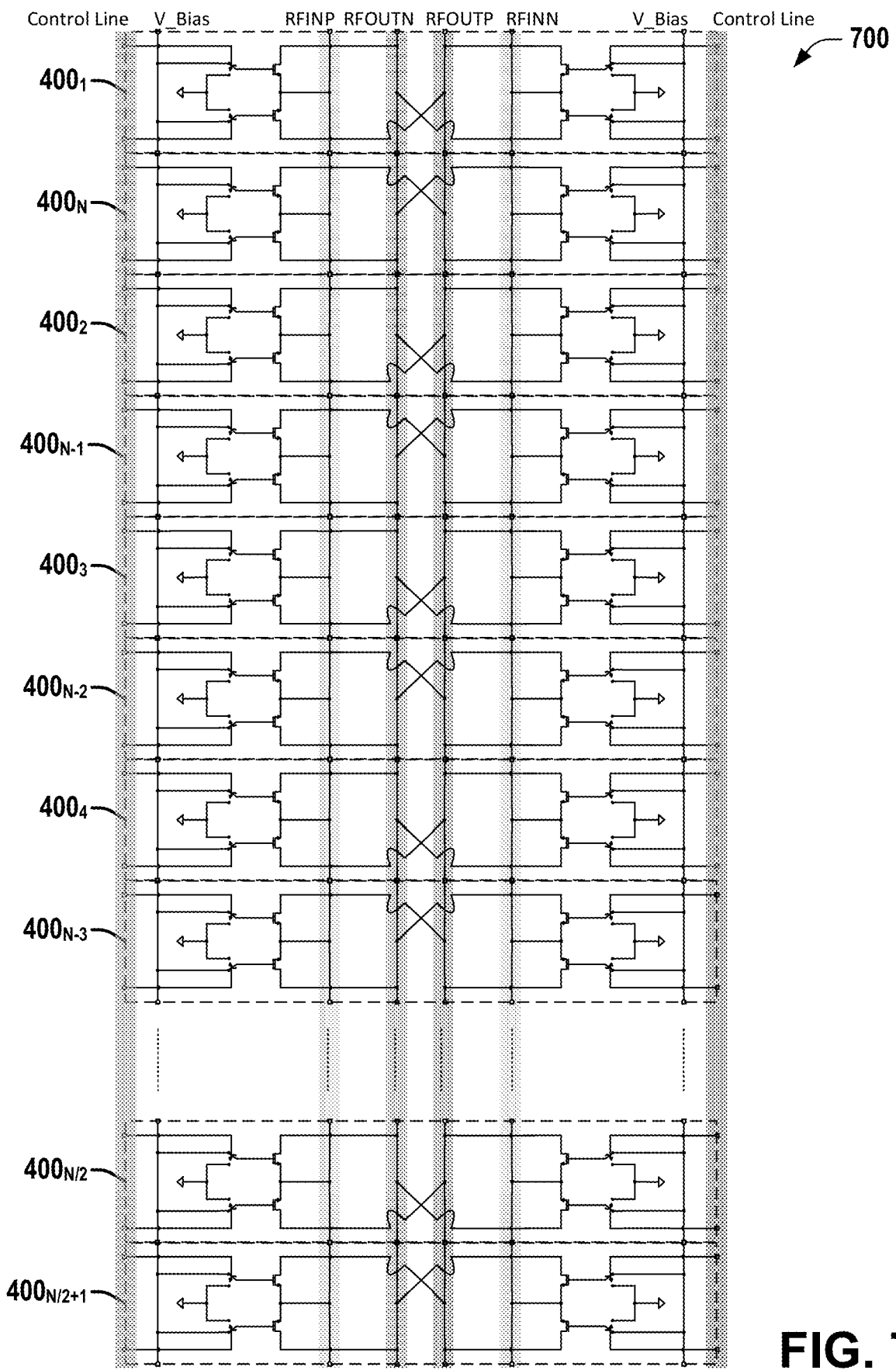
FIG. 7 is a diagram illustrating an example variable gain amplifier comprising multiple example bit slices arranged vertically, according to various aspects discussed herein.

Referring to FIG. 7, illustrated is a diagram showing an example variable gain amplifier 700 with a vertical layout of bit slices $400_i$ that can be employed according to various aspects discussed herein. In the layout shown in FIG. 7, all the bit slices $400_i$ are stacked vertically with the input high frequency traces RFINN and RFINP aligned vertically and connected together. The output high frequency traces RFOUTP and RFOUTN are also vertically aligned and connected together in FIG. 7. The RFOUTP, RFOUTN, RFINP, and RFINN traces can be placed at the middle of the bit slices $400_i$ to reduce the cross-coupling from the CMOS devices. The simple/straight connections for input/output RF path for bi-directional connectivity can provide less parasitic along with good gain performance and power consumption performance.

Figure 8:
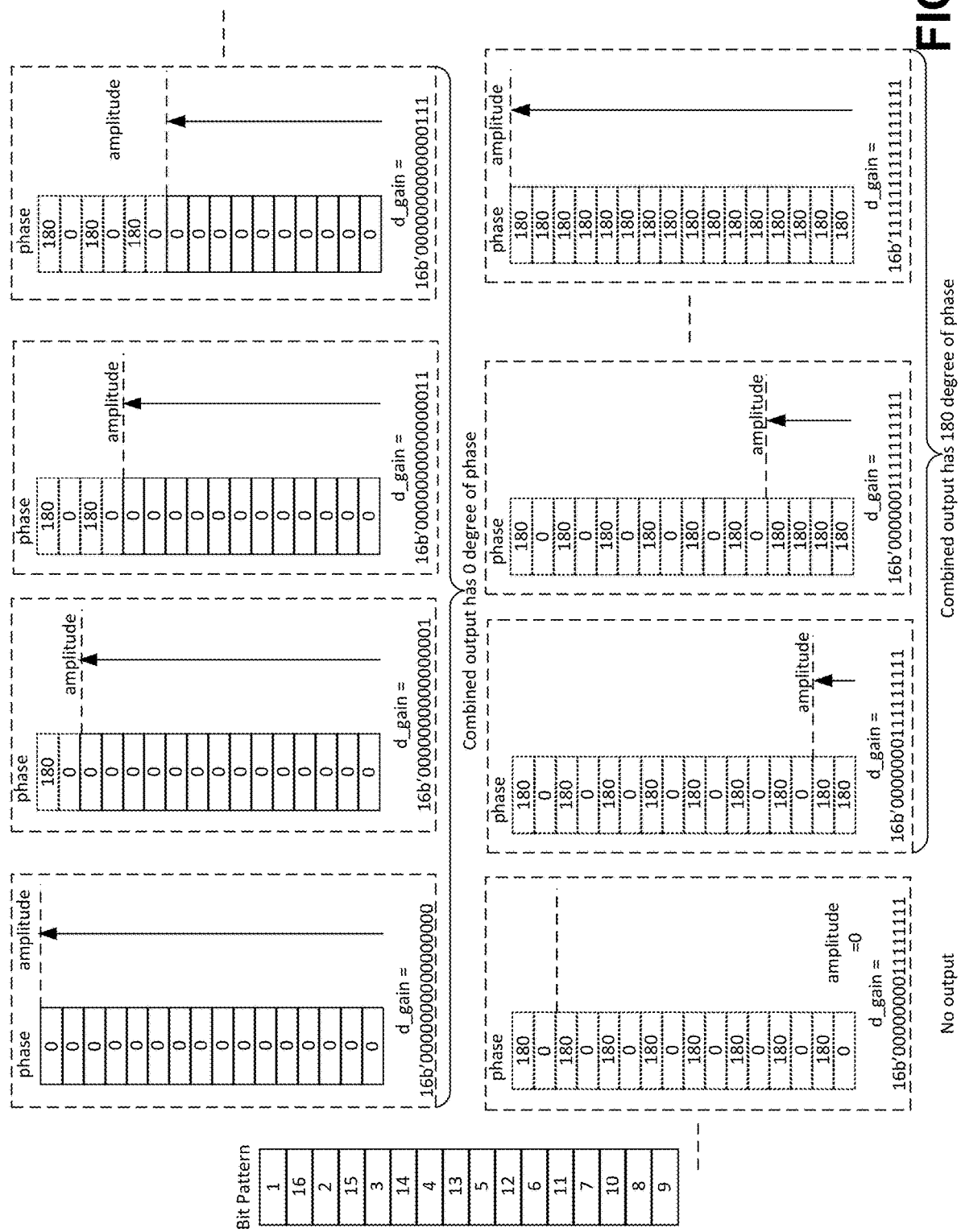
FIG. 8 is a diagram illustrating an example of gain control for an example variable gain amplifier comprising 16 bit slices, according to various aspects discussed herein.

Referring to FIG. 8, illustrated is a diagram showing an example of gain control for an example variable gain amplifier according to FIG. 6 that comprises 16 bit slices $400_i$, according to various aspects discussed herein.

Figure 9:
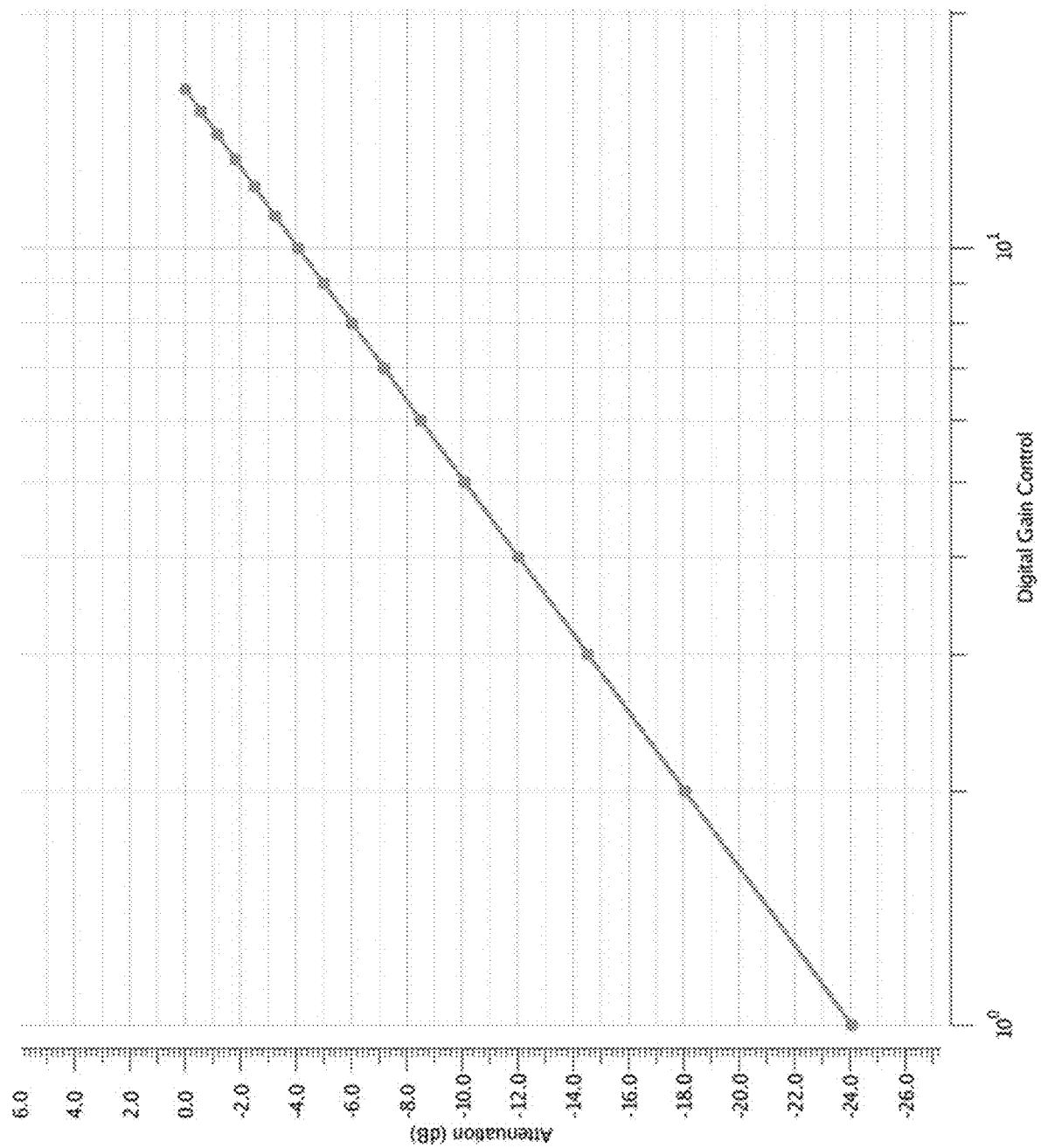
FIG. 9 is a diagram illustrating a graph of simulated gain as a function of digital settings over process, voltage, and temperature variations for example embodiments, according to various aspects discussed herein.
Figure 10:
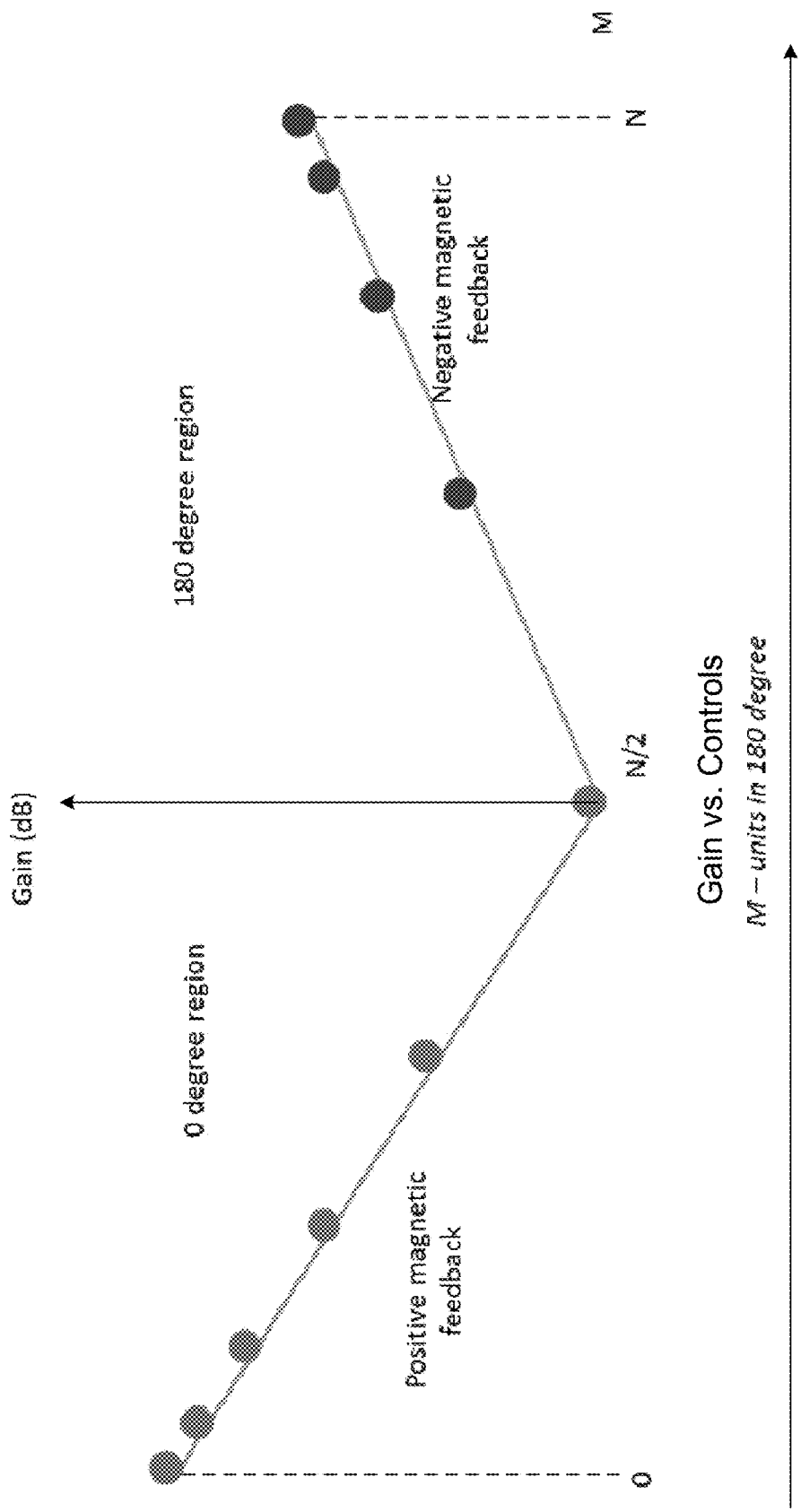
FIG. 10 is a diagram illustrating a graph of gain as a function of controls for an example variable gain amplifier comprising N bit slices, according to various aspects discussed herein.

Referring to FIG. 9, illustrated is a diagram showing a graph of simulated gain as a function of digital settings over process, voltage, and temperature variations for an example variable gain amplifier according to various aspects discussed herein. As can be seen in FIG. 9, the gain of the variable gain amplifier of FIG. 6 is very linear with respect to the digital controls, and does not vary with process, voltage, and temperature variations. Referring to FIG. 10, illustrated is a graph of gain as a function of controls for an example variable gain amplifier of N bit slices $400_i$, according to various aspects discussed herein. As shown in FIG. 10, in various embodiments, the negative and positive magnetic feedbacks can give different gain control slopes, which can have different gain steps for the digital controls.

Figure 11:
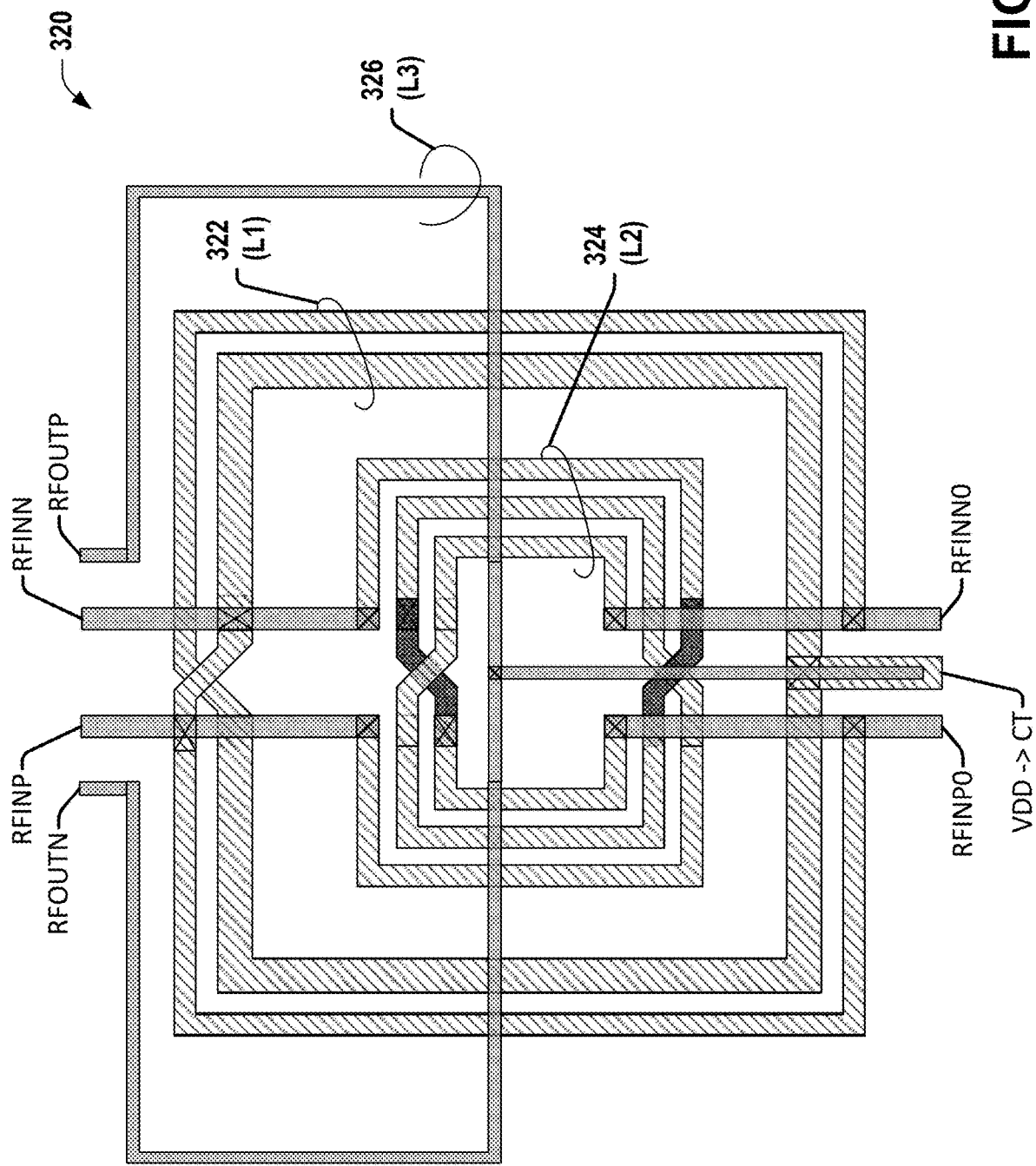
FIG. 11 is a diagram illustrating an example matching network comprising three inductors that can be employed in a signal buffer, according to various aspects discussed herein.
Figure 12:
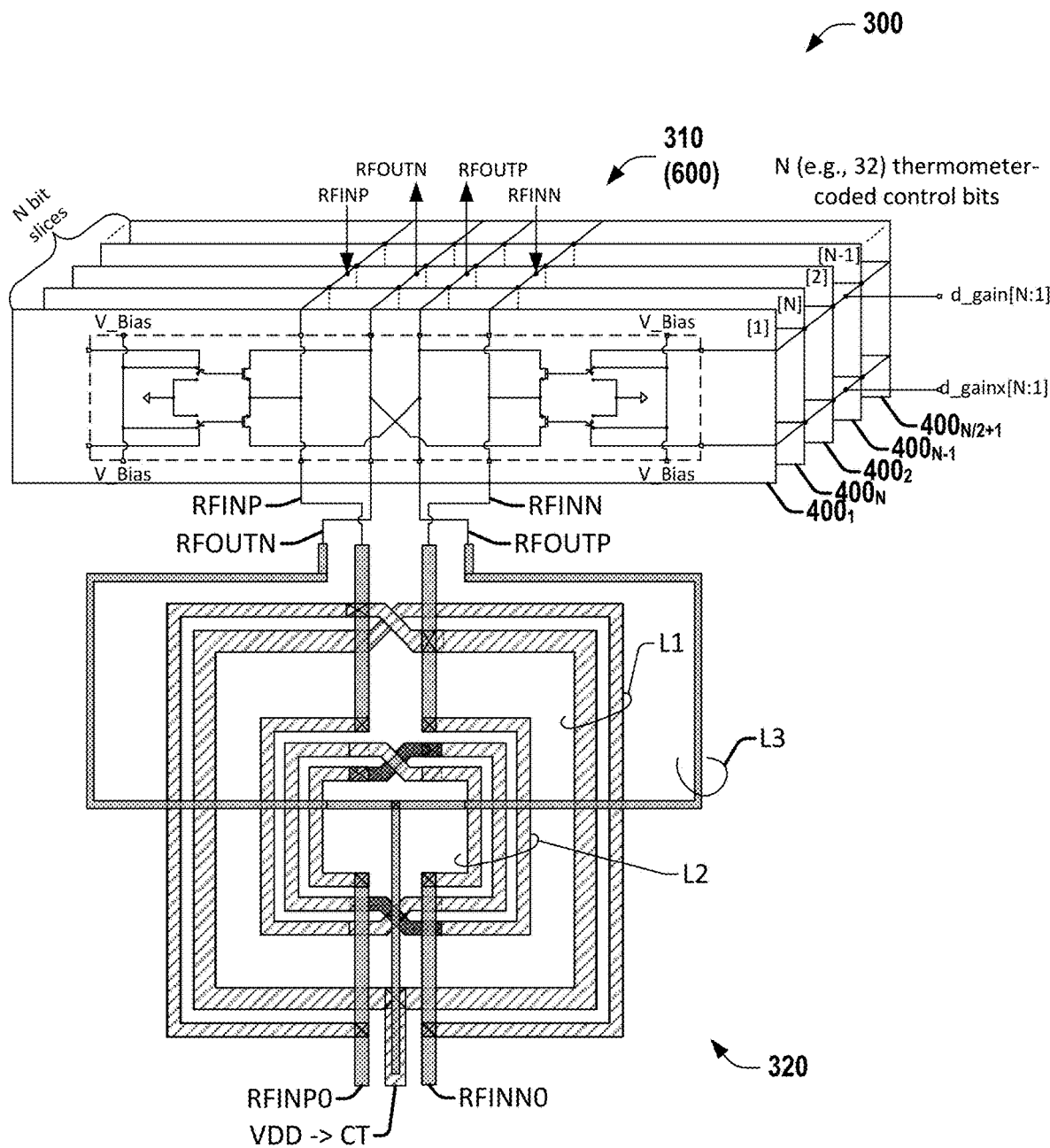
FIG. 12 is a diagram illustrating an example embodiment of a wideband signal buffer comprising the variable gain amplifier of FIG. 6 and the matching network of FIG. 11, according to various aspects discussed herein.
Figure 13:
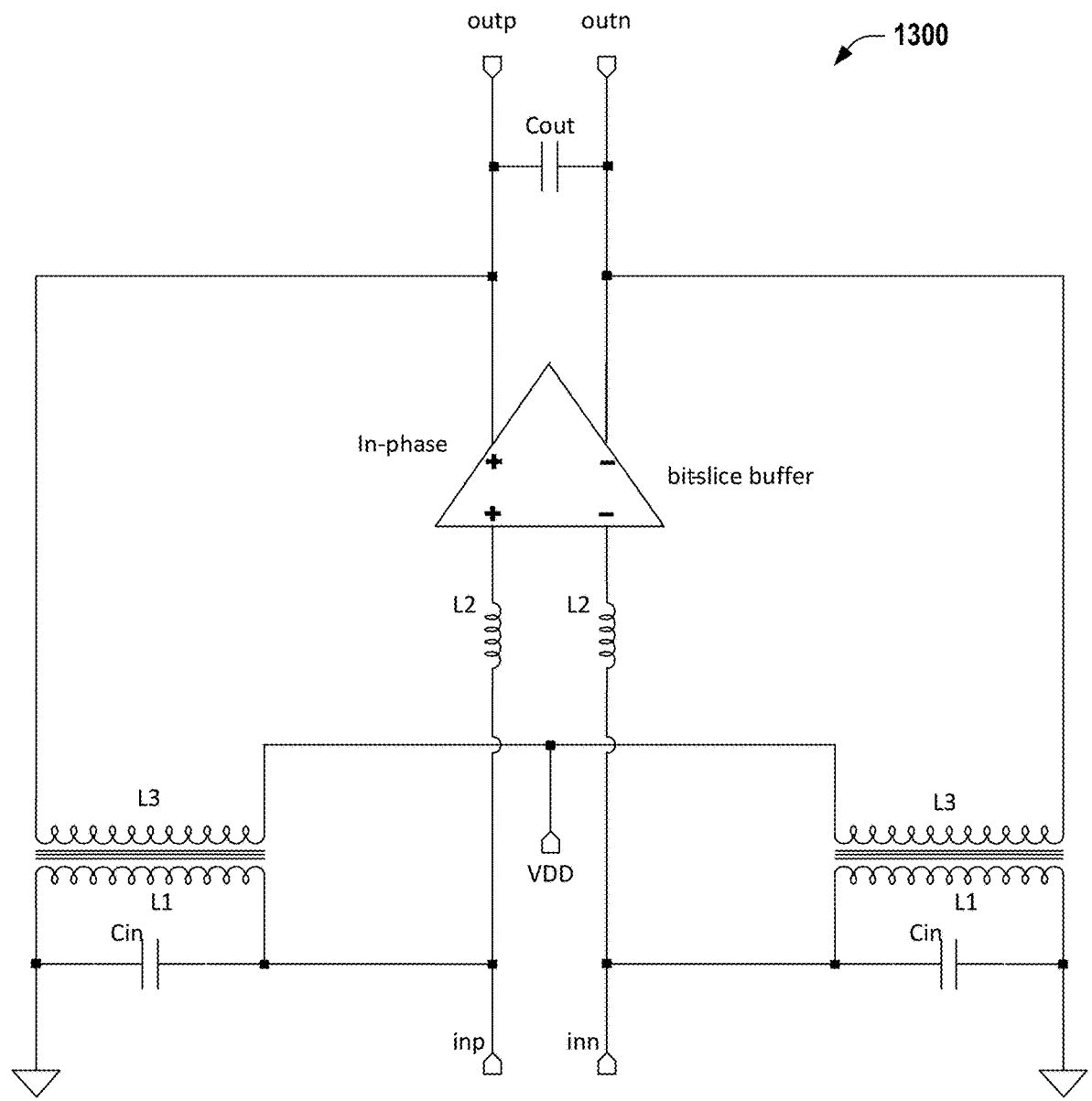
FIG. 13 is a diagram illustrating a model of in-phase operation of the example signal buffer of FIG. 12, according to various aspects discussed herein.
Figure 14:
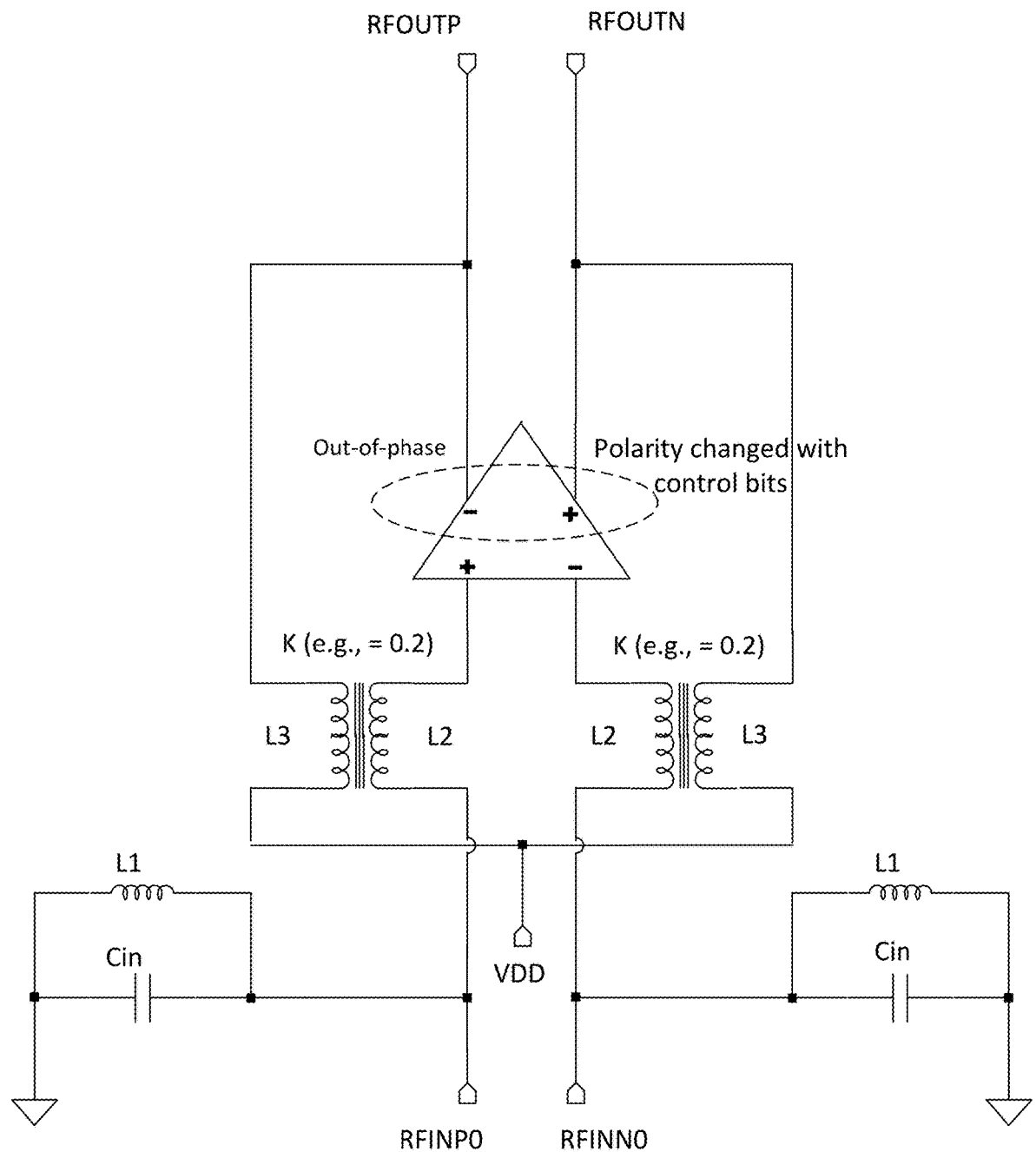
FIG. 14 is a diagram illustrating a model of out-of-phase operation of the example signal buffer of FIG. 12, according to various aspects discussed herein.

In various embodiments, wide band matching can be employed for the VGA (Variable Gain Amplifier) input and output impedance matching. In various embodiments, the matching network 320 of signal buffer 300 can comprise three inductors. Referring to FIG. 11, illustrated is a diagram showing an example matching network comprising three inductors (L1 (322), L2 (324), and L3 (326)) that can be employed in a signal buffer according to various aspects discussed herein. Referring to FIG. 12, illustrated is a diagram showing an example embodiment of a wideband signal buffer comprising the variable gain amplifier of FIG. 6 and matching network of FIG. 11, according to various aspects discussed herein. Referring to FIG. 13, illustrated is a model of an example of in-phase operation of the signal buffer of FIG. 12, according to various aspects discussed herein. Referring to FIG. 14, illustrated is a model of an example of out-of-phase operation of the signal buffer of FIG. 12, according to various aspects discussed herein.

The first inductor 322 (L1) can be used as the input signal DC operation point bias. The second inductor 324 (L2) can be used to create the first pole, and the third inductor 326 (L3) can be used to create the second pole and third pole. Equation (3) is the open loop transfer function for the matching network of FIG. 12:

$$TI = \frac{1}{L_2 C_1 C_3} s \cdot \frac{1}{S^2 + \frac{L_{12}}{L_1 L_2 C_1}} \cdot \frac{1}{s^2 + \frac{2}{R_L C_3} s + \frac{1}{L_3 C_3}} \qquad (3)$$

where $C_1$ is the input parasitic capacitance of the VGA and $C_3$ is the output parasitic capacitance of the VGA.

In various embodiments (e.g., in the example embodiment shown in FIG. 11), the third inductor 326 (L3) can be routed to overlap the first inductor 322 (L1) and the second inductor 324 (L2), and the windings of the first inductor 322 (L1) can surround the second inductor 324 (L2). The first inductor 322 (L1) can have a bigger winding area to have a higher value, because L1 can perform as an AC choke and a DC bias inductance, for which a larger value is advantageous. The second inductor 324 (L2) can be used to create the first pole.

Figures 15A, 15B:
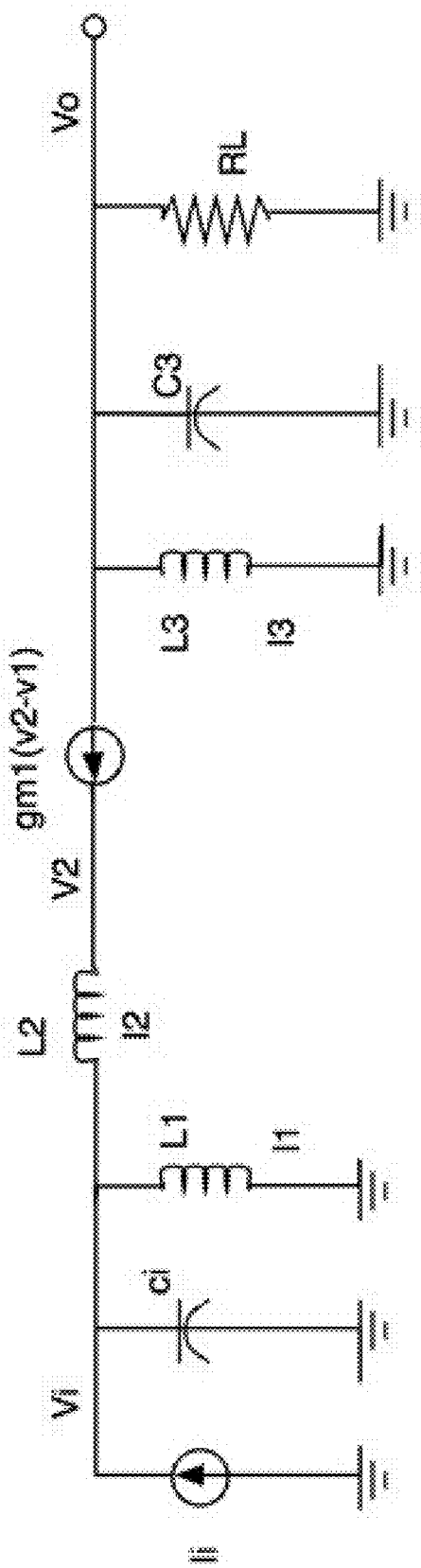
FIG. 15A is a diagram illustrating a model of the example transformer and variable strength/polarity buffer of FIG. 12, according to various aspects discussed herein.
FIG. 15B illustrates the closed-loop transfer function for the example matching network of FIG. 12, based on the model of FIG. 15A.

Referring to FIG. 15A, illustrated is a model of an example transformer and variable strength/polarity buffer of FIG. 12, in accordance with various aspects discussed herein.

Referring to FIG. 15B, illustrated is the closed-loop transfer function for the example matching network of FIG. 12, based on the model of FIG. 15A. The closed-loop transfer function is also show in equation (4):

$$\frac{V_o}{I_i} = \frac{RLs(m13 + gm1m13(L2 + m23)s - gm1m12(L3 + m23)s))}{(RL + (L3 + gm1(L2 - m12 + m23)RL)s + (gm1(L2L3 - L3m12 + (m13 - m23)m23) + ciL1RL + c3L3RL)s \wedge 2 + (c3gm1(L2L3 - L3m12 + (m13 - m23)m23)RL + ci(-m13 \wedge 2 - gm1m12(m12 + m13)RL + L1(L3 + gm1(L2 + m23)RL)))s \wedge 3 - ci(gm1(L3m12 \wedge 2 + L2m13 \wedge 2 - 2m12m13m23 + L1(-L2L3 + m23 \wedge 2)) + c3(-L1L3 + m13 \wedge 2)RL)s \wedge 4 - c3cigm1(L3m12 \wedge 2 + m13(L2m13 - 2m12m23) + L1(-L2L3 + m23 \wedge 2))RLs \wedge 5)} \qquad (4)$$

The transfer function of FIG. 15B and equation (4) yields a bandpass characteristic. In contrast to existing systems, in various embodiments discussed herein is that, by varying the strength and polarity of the signal current in L3 by means of programming the gain (gm1), the total transimpedance response can be changed, including the shape of the passband. The effect is basically to sum a variable negative or positive feedback into the open-loop transfer function, as well as to add a second pole, to provide a bandpass characteristic with adjustable peaking or damping.

Figure 16:
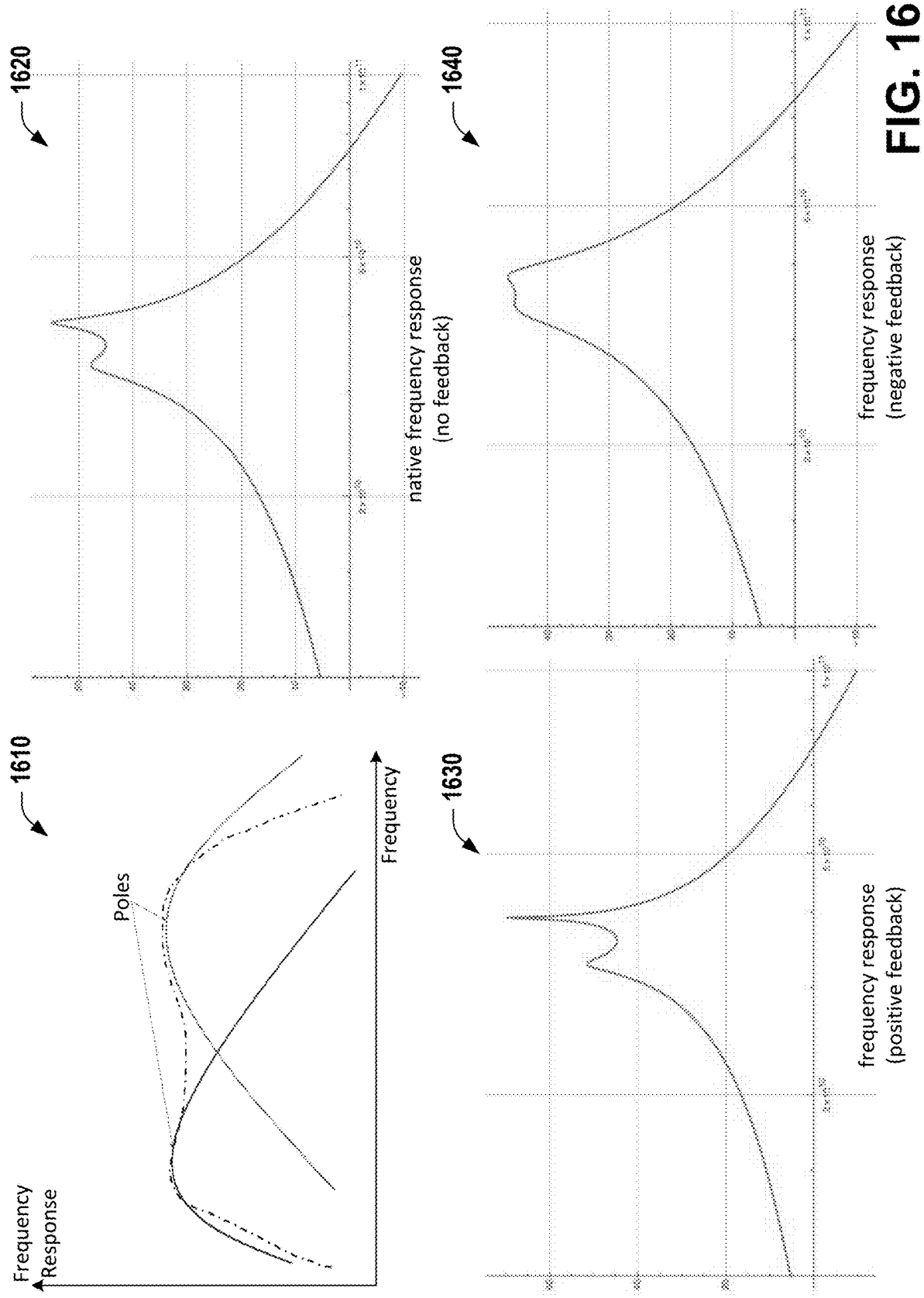
FIG. 16 is four diagrams illustrating a qualitative illustration of the poles of the feedback response of example matching networks discussed herein, along with example simulated frequency response of example embodiments for no feedback, positive feedback, and negative feedback, according to various aspects discussed herein.

Referring to FIG. 16, illustrated is a diagram showing a qualitative illustration 1610 of the poles of the feedback response of an example matching network as discussed herein, along with simulated frequency response of an example embodiment with no feedback at 1620, with positive feedback at 1630, and with negative feedback at 1640. FIG. 16 at 1620-1640 shows the effect of varying the magnitude and polarity of the buffer amplifier transconductance gm1 upon the shape of the bandpass. As can be seen in FIG. 16, various embodiments discussed herein are capable of modifying the shape of the matching transfer function, which can be useful, for example, in a cascade of transfer functions, to help optimize the composite response. For the scenario shown in 1620-1640, negative feedback provides the flattest response; in some other scenarios, positive or no feedback may be optimal.

Figure 17:
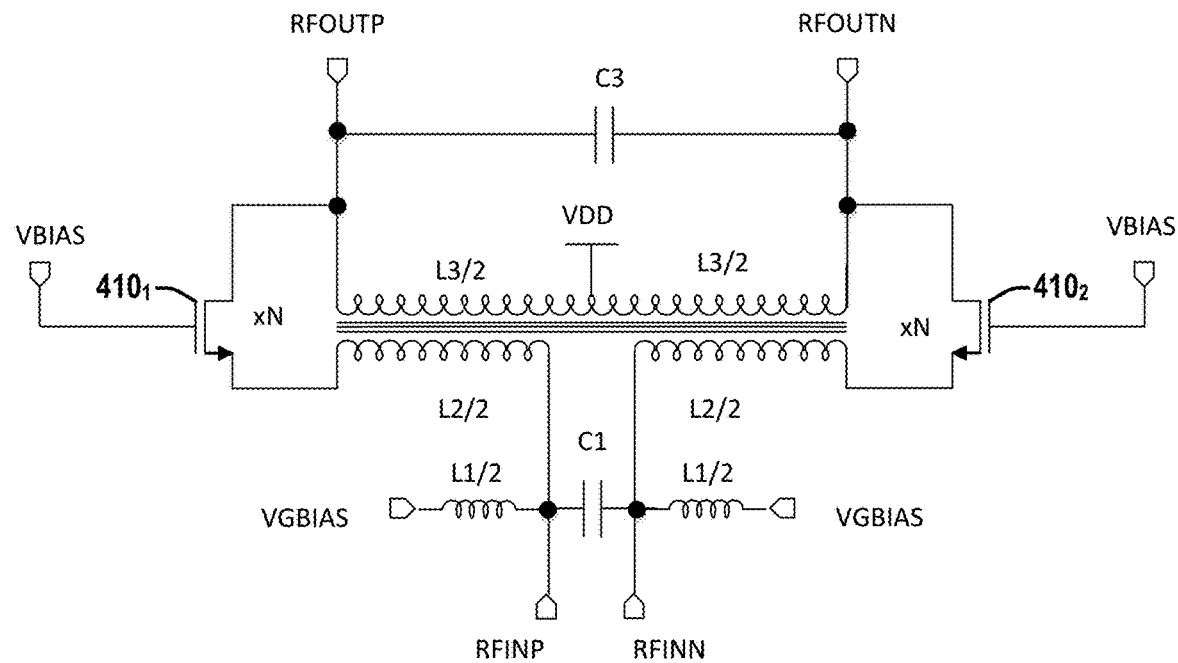
FIG. 17 is a pair of diagrams illustrating example negative feedback (top) and positive feedback (bottom) of an example signal buffer according to various aspects discussed herein.
Figure 17:
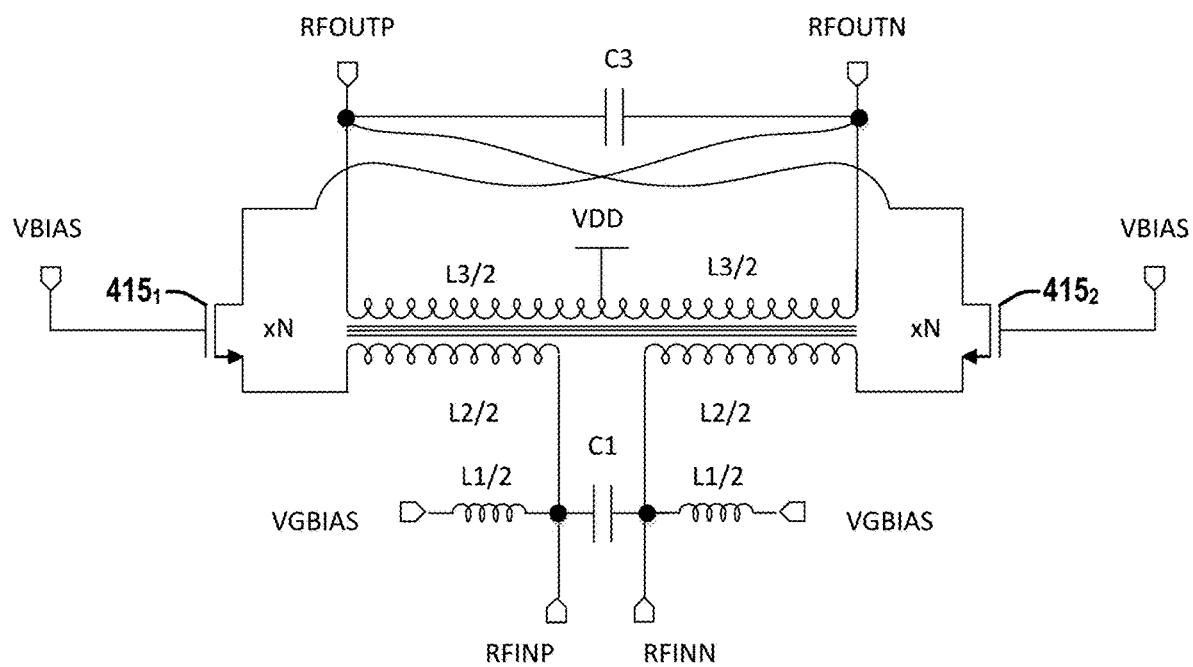

Referring to FIG. 17, illustrated is a pair of diagrams showing examples of negative magnetic feedback (top diagram) and positive magnetic feedback (bottom diagram) of an example embodiment of a wideband signal buffer, in accordance with various aspects discussed herein.

If the digital control (e.g., d_gain) value (M) is smaller than N/2, the output signals (RFOUTP, RFOUTN) have 0 degree of phase shift from the input, and the L3 and L2 inductors can provide negative magnetic feedback between the VGA output and input.

If the digital control (e.g., d_gain) value (M) is larger than N/2, the output signals (RFOUTP, RFOUTN) have 180 degrees of phase shift from the input, and the L3 and L2 inductors can provide positive magnetic feedback between the VGA output and input.

Figure 18:
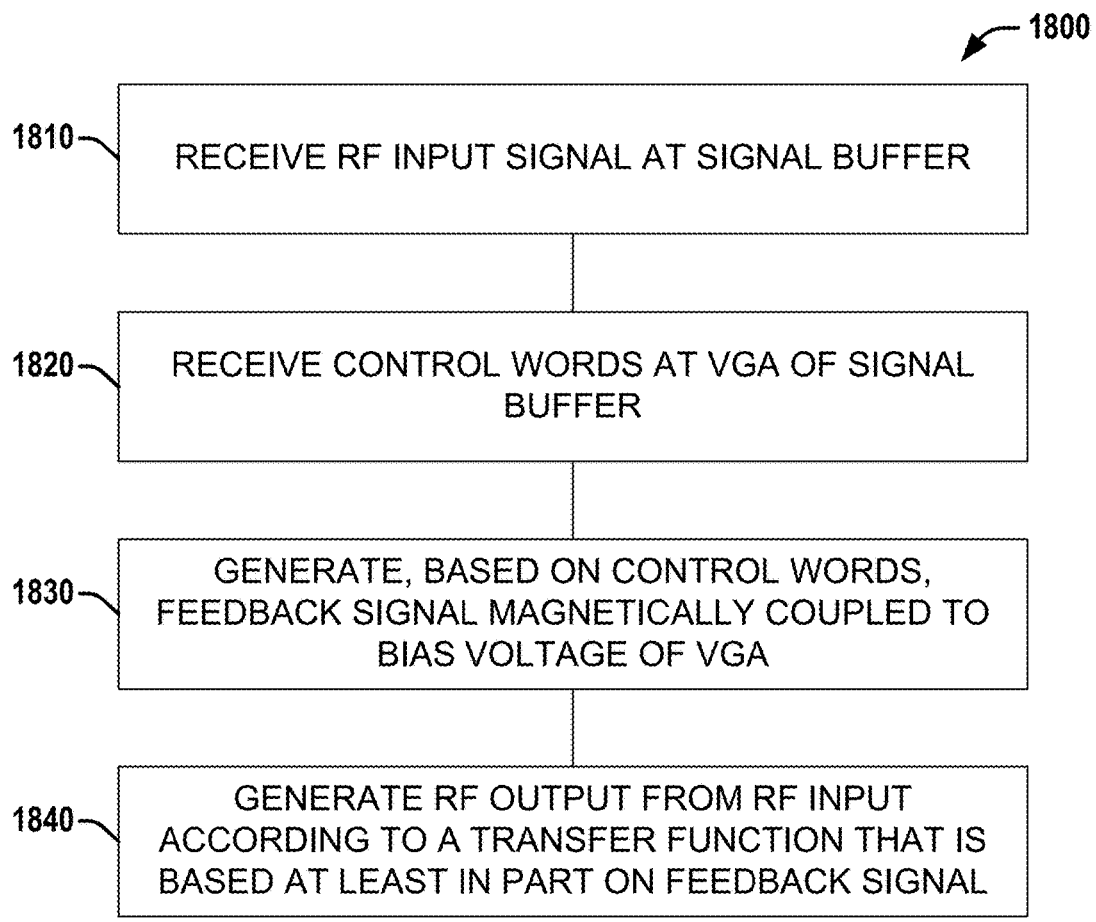
FIG. 18 illustrates a flow diagram of an example method of employing a wideband signal buffer according to various aspects described herein.

Referring to FIG. 18, illustrated is a flow diagram of an example method 1800 of employing a wideband signal buffer according to various aspects described herein. In some aspects, method 1800 can be performed at a transmitter (e.g., of a mobile device such as a UE or an access point such as an eNB or a gNB, etc.). In other aspects, a machine readable medium can store instructions associated with method 1800 that, when executed, can cause a transmitter to perform the acts of method 1800.

At 1810, an RF input signal can be received at a signal buffer in accordance with aspects described herein.

At 1820, a pair of control words can be received at a variable gain amplifier of the signal buffer.

At 1830, a feedback signal can be generated by the signal buffer, wherein an amplitude and a phase of a feedback signal are based on the pair of control words, and wherein a bias voltage of the VGA is magnetically coupled to the feedback signal.

At 1840, the signal buffer can generate an RF output signal based on the RF input signal according to a transfer function that is based at least in part on the feedback signal.

Additionally or alternatively, method 1800 can include one or more other acts described herein in connection with various aspects discussed herein.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is a signal buffer configured to be employed within a communication device, comprising: a variable gain amplifier (VGA) configured to receive one or more control words and to output a feedback signal, wherein both an amplitude of the feedback signal and a phase of the feedback signal are based on the one or more control words and on a bias voltage; and a matching network comprising a first inductor L1 configured to output the bias voltage, a second inductor L2, and a third inductor L3 configured to receive the feedback signal from the VGA, and wherein the first inductor L1, the second inductor L2, and the third inductor L3 are magnetically coupled to each other, wherein the signal buffer is configured to receive a RF (Radio Frequency) input and to generate a RF output from the RF input based on a transfer function of the signal buffer, wherein the transfer function is based at least in part on the feedback signal.

Example 2 comprises the subject matter of any variation of any of example(s) 1, wherein the first inductor L1 is arranged surrounding the second inductor L2.

Example 3 comprises the subject matter of any variation of any of example(s) 1-2, wherein the second inductor L2 is configured to create a first pole of the transfer function.

Example 4 comprises the subject matter of any variation of any of example(s) 1-3, wherein the third inductor L3 is configured to create a second pole of the transfer function, wherein the second pole depends on the amplitude of the feedback signal and the phase of the feedback signal.

Example 5 comprises the subject matter of any variation of any of example(s) 1-4, wherein the VGA comprises N bit slices, wherein N is an even positive integer, wherein each of the one or more control words comprises N bits, and wherein each bit slice of the N bit slices is configured to receive an associated bit of each control word of the one or more control words.

Example 6 comprises the subject matter of any variation of any of example(s) 5, wherein, for each bit slice, the associated bit of each control word of the one or more control words determines whether that bit slice is configured to generate an in-phase output or an out-of-phase output.

Example 7 comprises the subject matter of any variation of any of example(s) 6, wherein, for each bit slice, both the input impedance and the output impedance are independent of whether that bit slice generates the in-phase output or the out-of-phase output.

Example 8 comprises the subject matter of any variation of any of example(s) 6-7, wherein each bit slice comprises a first pair of transistors configured to generate the in-phase output and a second pair of transistors configured to generate the out-of-phase output.

Example 9 comprises the subject matter of any variation of any of example(s) 8, wherein, for each bit slice, the parasitic capacitances of the first pair of transistors neutralize the parasitic capacitances of the second pair of transistors.

Example 10 comprises the subject matter of any variation of any of example(s) 6-9, wherein the one or more control words are a first control word and a second control word, wherein the second control word is a bitwise complement of the first control word.

Example 11 comprises the subject matter of any variation of any of example(s) 6-10, wherein each control word of the one or more control words is thermometer-coded.

Example 12 comprises the subject matter of any variation of any of example(s) 11, wherein the N/2 bit slices associated with the first N/2 bits of each control word of the one or more control words are interleaved with and have a reversed ordering from the N/2 bit slices associated with the last N/2 bits of each control word of the one or more control words.

Example 13 is a signal buffer configured to be employed within a communication device, comprising: means for amplifying configured to receive one or more control words and to output a feedback signal, wherein both an amplitude of the feedback signal and a phase of the feedback signal are based on the one or more control words and on a bias voltage; and means for matching configured to output the bias voltage and to receive the feedback signal from the means for amplifying, wherein the means for matching are configured to magnetically couple the bias voltage to the feedback signal, wherein the signal buffer is configured to receive a RF (Radio Frequency) input and to generate a RF output from the RF input based on a transfer function of the signal buffer, wherein the transfer function is based at least in part on the feedback signal.

Example 14 comprises the subject matter of any variation of any of example(s) 13, wherein the means for matching comprises a first inductor L1, a second inductor L2, and a third inductor L3.

Example 15 comprises the subject matter of any variation of any of example(s) 14, wherein the first inductor L1 is arranged surrounding the second inductor L2.

Example 16 comprises the subject matter of any variation of any of example(s) 14-15, wherein the second inductor L2 is configured to create a first pole of the transfer function.

Example 17 comprises the subject matter of any variation of any of example(s) 14-16, wherein the third inductor L3 is configured to create a second pole of the transfer function, wherein the second pole depends on the amplitude of the feedback signal and the phase of the feedback signal.

Example 18 is a non-transitory machine readable medium comprising instructions that, when executed, cause a communication device to: receive a RF (Radio Frequency) input signal at a signal buffer; receive a pair of control words at a variable gain amplifier (VGA) of the signal buffer; generate a feedback signal, wherein an amplitude of the feedback signal and a phase of the feedback signal are based on the pair of control words, and wherein a bias voltage of the VGA is magnetically coupled to the feedback signal; and generate a RF output signal via the signal buffer, wherein the RF output signal is generated based on the RF input signal according to a transfer function of the signal buffer, wherein the transfer function is based at least in part on the feedback signal.

Example 19 comprises the subject matter of any variation of any of example(s) 18, wherein the feedback signal and the bias voltage are generated via a matching network that comprises a first inductor L1, a second inductor L2, and a third inductor L3.

Example 20 comprises the subject matter of any variation of any of example(s) 18-19, wherein the VGA comprises N bit slices, wherein N is an even positive integer, and wherein each control word of the pair of control words comprises N bits, wherein each bit slice of the N bit slices is associated with a distinct bit of each control word of the pair of control words.

Example 21 comprises an apparatus comprising means for executing any of the described operations of examples 1-20.

Example 22 comprises a machine readable medium that stores instructions for execution by a processor to perform any of the described operations of examples 1-20.

Example 23 comprises an apparatus comprising circuitry configured to perform any of the described operations of examples 1-20.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A signal buffer configured to be employed within a communication device, comprising:
    a variable gain amplifier (VGA) configured to receive one or more control words and to output a feedback signal, wherein both an amplitude of the feedback signal and a phase of the feedback signal are based on the one or more control words and on a bias voltage; and
    a matching network comprising a first inductor L1 configured to output the bias voltage, a second inductor L2, and a third inductor L3 configured to receive the feedback signal from the VGA, wherein the first inductor L1 is arranged surrounding the second inductor L2, and wherein the first inductor L1, the second inductor L2, and the third inductor L3 are magnetically coupled to each other,
    wherein the signal buffer is configured to receive a RF (Radio Frequency) input and to generate a RF output from the RF input based on a transfer function of the signal buffer, wherein the transfer function is based at least in part on the feedback signal.

2. The signal buffer of claim 1, wherein the second inductor L2 is configured to create a first pole of the transfer function.

3. The signal buffer of claim 1, wherein the third inductor L3 is configured to create a second pole of the transfer function, wherein the second pole depends on the amplitude of the feedback signal and the phase of the feedback signal.

4. The signal buffer of claim 1, wherein the VGA comprises N bit slices, wherein N is an even positive integer, wherein each of the one or more control words comprises N bits, and wherein each bit slice of the N bit slices is configured to receive an associated bit of each control word of the one or more control words.

5. The signal buffer of claim 4, wherein, for each bit slice, the associated bit of each control word of the one or more control words determines whether that bit slice is configured to generate an in-phase output or an out-of-phase output.

6. The signal buffer of claim 5, wherein, for each bit slice, both the input impedance and the output impedance are independent of whether that bit slice generates the in-phase output or the out-of-phase output.

7. The signal buffer of claim 5, wherein each bit slice comprises a first pair of transistors configured to generate the in-phase output and a second pair of transistors configured to generate the out-of-phase output.

8. The signal buffer of claim 7, wherein, for each bit slice, the parasitic capacitances of the first pair of transistors neutralize the parasitic capacitances of the second pair of transistors.

9. The signal buffer of claim 5, wherein the one or more control words are a first control word and a second control word, wherein the second control word is a bitwise complement of the first control word.

10. The signal buffer of claim 5, wherein each control word of the one or more control words is thermometer-coded.

11. The signal buffer of claim 10, wherein the N/2 bit slices associated with the first N/2 bits of each control word of the one or more control words are interleaved with and have a reversed ordering from the N/2 bit slices associated with the last N/2 bits of each control word of the one or more control words.

12. A signal buffer configured to be employed within a communication device, comprising:
    means for amplifying configured to receive one or more control words and to output a feedback signal, wherein both an amplitude of the feedback signal and a phase of the feedback signal are based on the one or more control words and on a bias voltage; and
    means for matching configured to output the bias voltage and to receive the feedback signal from the means for amplifying, wherein the means for matching are configured to magnetically couple the bias voltage to the feedback signal, wherein the means for matching comprises a first inductor L1, a second inductor L2, and a third inductor L3, wherein the third inductor L3 is configured to create a second pole of the transfer function, wherein the second pole depends on the amplitude of the feedback signal and the phase of the feedback signal,
    wherein the signal buffer is configured to receive a RF (Radio Frequency) input and to generate a RF output from the RF input based on a transfer function of the signal buffer, wherein the transfer function is based at least in part on the feedback signal.

13. The signal buffer of claim 12, wherein the first inductor L1 is arranged surrounding the second inductor L2.

14. The signal buffer of claim 12, wherein the second inductor L2 is configured to create a first pole of the transfer function.

15. A non-transitory machine readable medium comprising instructions that, when executed, cause a communication device to:
    receive a RF (Radio Frequency) input signal at a signal buffer;
    receive a pair of control words at a variable gain amplifier (VGA) of the signal buffer, wherein the VGA comprises N bit slices, wherein N is an even positive integer, and wherein each control word of the pair of control words comprises N bits, wherein each bit slice of the N bit slices is associated with a distinct bit of each control word of the pair of control words;
    generate a feedback signal, wherein an amplitude of the feedback signal and a phase of the feedback signal are based on the pair of control words, and wherein a bias voltage of the VGA is magnetically coupled to the feedback signal; and
    generate a RF output signal via the signal buffer, wherein the RF output signal is generated based on the RF input signal according to a transfer function of the signal buffer, wherein the transfer function is based at least in part on the feedback signal.

16. The machine readable medium of claim 15, wherein the feedback signal and the bias voltage are generated via a matching network that comprises a first inductor L1, a second inductor L2, and a third inductor L3.

* * * * *